United States Patent
Sato et al.

(10) Patent No.: US 10,314,175 B2
(45) Date of Patent: Jun. 4, 2019

(54) ELECTRIC CONNECTION STRUCTURE AND ELECTRIC CONNECTION MEMBER

(71) Applicant: Japan Aviation Electronics Industry, Limited, Tokyo (JP)

(72) Inventors: Junya Sato, Tokyo (JP); Ryosuke Mitsui, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 15/613,752

(22) Filed: Jun. 5, 2017

(65) Prior Publication Data

US 2017/0273192 A1 Sep. 21, 2017

Related U.S. Application Data

(63) Continuation of application No. PCT/JP2015/083460, filed on Nov. 27, 2015.

(30) Foreign Application Priority Data

Feb. 26, 2015 (JP) ................................. 2015-036546

(51) Int. Cl.
*H05K 3/12* (2006.01)
*C09D 11/38* (2014.01)
(Continued)

(52) U.S. Cl.
CPC ......... *H05K 3/1291* (2013.01); *C09D 11/037* (2013.01); *C09D 11/14* (2013.01); *C09D 11/322* (2013.01); *C09D 11/38* (2013.01); *C09D 11/52* (2013.01); *H01R 4/026* (2013.01); *H01R 4/04* (2013.01); *H01R 4/70* (2013.01); *H05K 1/111* (2013.01); *H05K 3/0011* (2013.01); *H05K 3/321* (2013.01); *H05K 3/381* (2013.01); *H05K 3/382* (2013.01); *H05K 3/403* (2013.01); *H05K 3/4076* (2013.01); *H01R 12/52* (2013.01); *H05K 2201/0257* (2013.01);
(Continued)

(58) Field of Classification Search
USPC ......................................................... 174/260
See application file for complete search history.

(56) References Cited

U.S. PATENT DOCUMENTS

2003/0102466 A1* 6/2003 Kumakura ................. C09J 7/00
252/511
2008/0307991 A1* 12/2008 Tanaka ..................... H05K 3/182
101/492

(Continued)

FOREIGN PATENT DOCUMENTS

JP 2003045517 A 2/2003
JP 2004107728 A 4/2004
(Continued)

*Primary Examiner* — Stanley Tso
(74) *Attorney, Agent, or Firm* — Muncy, Geissler, Olds & Lowe, P.C.

(57) ABSTRACT

There is provided an electric connection member having a substrate, an insulating adhesive layer provided on the substrate, and a conductive interconnect, wherein the electric connection member is provided with a recess that opens at a side of the insulating adhesive layer, the conductive interconnect is disposed in the recess, a metal nano-ink is disposed on the conductive interconnect, and all of the metal nano-ink is contained inside the recess.

16 Claims, 5 Drawing Sheets

(51) Int. Cl.
*C09D 11/52* (2014.01)
*H01R 4/02* (2006.01)
*H01R 4/04* (2006.01)
*H01R 4/70* (2006.01)
*H05K 3/00* (2006.01)
*H05K 3/38* (2006.01)
*H05K 3/40* (2006.01)
*C09D 11/037* (2014.01)
*C09D 11/14* (2006.01)
*C09D 11/322* (2014.01)
*H05K 1/11* (2006.01)
*H05K 3/32* (2006.01)
*H01R 12/52* (2011.01)

(52) U.S. Cl.
CPC .............. *H05K 2201/09472* (2013.01); *H05K 2201/10659* (2013.01); *Y02P 70/611* (2015.11)

(56) References Cited

U.S. PATENT DOCUMENTS

2009/0308645 A1 12/2009 Lee et al.
2011/0266578 A1* 11/2011 Kanisawa ................. C09J 7/00
  257/98
2013/0228786 A1* 9/2013 Park .................... H01L 51/5268
  257/72

FOREIGN PATENT DOCUMENTS

| | | |
|---|---|---|
| JP | 2006202586 A | 8/2006 |
| JP | 2010265543 A | 11/2010 |
| JP | 2012072418 A | 4/2012 |
| JP | 2012162767 A | 8/2012 |
| JP | 2014031542 A | 2/2014 |
| JP | 2014040630 A | 3/2014 |
| JP | 2014184381 A | 10/2014 |
| WO | WO 2011/119630 A1 | 9/2011 |

* cited by examiner

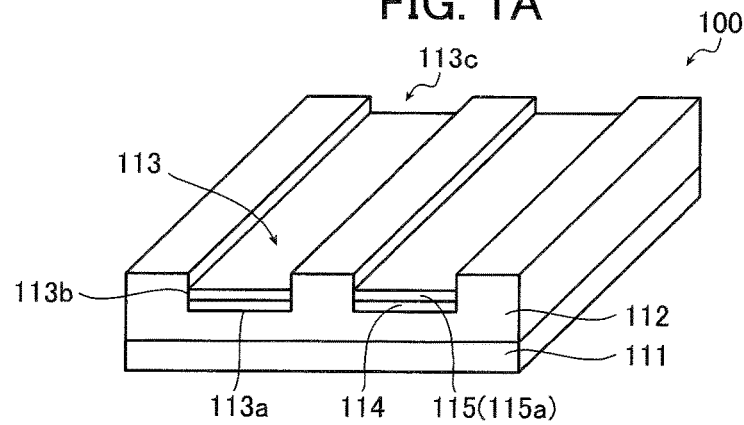
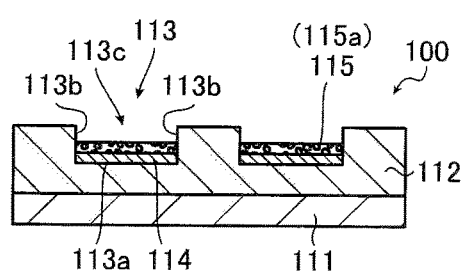
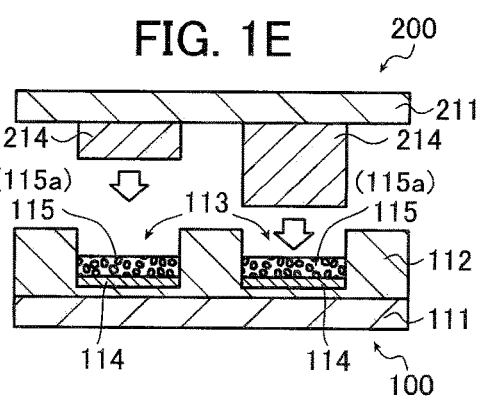
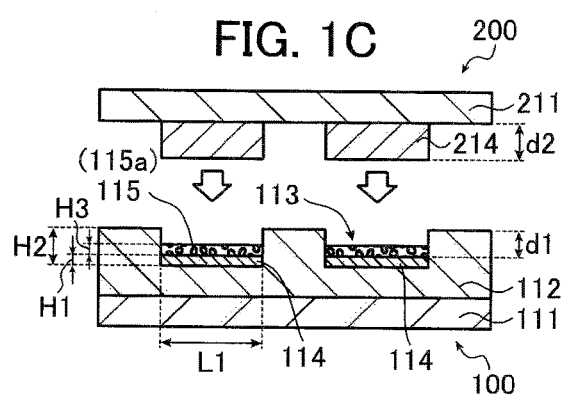
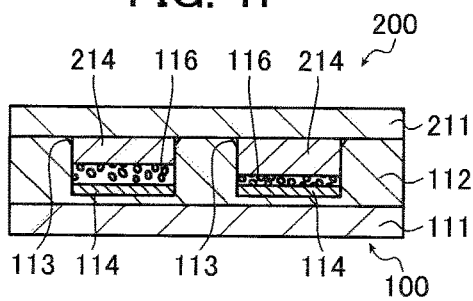
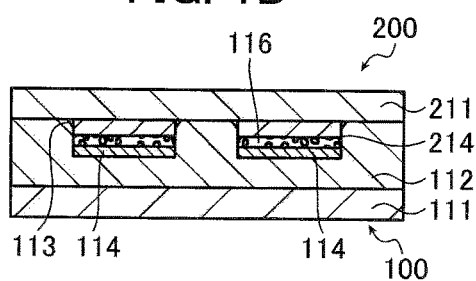

ELECTRIC CONNECTION STRUCTURE AND ELECTRIC CONNECTION MEMBER

BACKGROUND OF THE INVENTION

The present invention relates to electric connection members, mounting structures of electronic component assemblies, and intermediate members used for producing electric connection members.

Conventionally, anisotropic conductive films have been used in connection of circuit boards in liquid crystal displays. For such an anisotropic conductive film, the structure is employed in which metal particles are dispersed in an insulating adhesive sheet at a predetermined concentration. An anisotropic conductive film is disposed between two interconnect patterns, for instance, a display circuit board and a drive circuit, and heated and pressurized via a support substrate, whereby metal particles dispersed in the film come into contact with the two interconnect patterns to ensure the conduction.

In the connection between the two interconnect patterns, however, the metal particles and either interconnect pattern are connected on a point basis, and accordingly, when the connected interconnect patterns are bent or when the circuit board or the anisotropic conductive film is expanded and contracted under heating, the metal particles come off from the interconnect patterns, which causes the conduction between the two electrically-connected interconnects to be unstable. Aside from that, such an anisotropic conductive film uses a thermosetting adhesive. Accordingly, when a connection interconnect is bent, cracks may occur in an adhesive layer, and in addition, since the contact area between each interconnect pattern and metal particles is small, upon application of heat and pressure, cracks may occur in interconnect patterns because of metal particles.

Meanwhile, JP 2003-045517 A discloses an electric connection member in which a plurality of elongated lead layers are arranged in parallel to each other and joined and fixed to a joint substrate formed of a thin plate via an adhesive layer, as well as an electrode substrate. The disclosure is described below with reference to, among attached drawings, FIG. 6 corresponding to FIG. 1 of JP 2003-045517 A. In an electric connection member 500 in which a plurality of elongated lead layers 3 are arranged in parallel to each other and joined and fixed to a joint substrate 5 formed of a thin plate via an adhesive layer 4, the lead layers 3 are formed to have a width narrower than that of each strip interconnect 61 of the electrode substrate 600 which is a counterpart in bonding with the electric connection member 500 and in which a plurality of strip interconnects 61 are arranged on a surface of a substrate 6 in parallel to each other and are connection counterparts of the lead layers 3. With this configuration, electric connection can be ensured without damaging opposing interconnect patterns.

In the electric connection member 500 described in JP 2003-045517 A, the lead layers 3 are formed on the adhesive layer 4 having a uniform thickness, and the adhesive layer 4 is formed by applying a pressure sensitive adhesive or an adhesive onto the joint substrate 5 (FIG. 6B). When this electric connection member 500 is connected to the electrode substrate 600 in which the strip interconnects 61 are formed on the surface of the substrate 6 or to an electronic component (e.g., semiconductor device) having an electrode, the adhesive layer 4 can be bonded with both lateral edge portions of a surface of each strip interconnect 61 (FIG. 6B).

In the electric connection member 500 and the electrode substrate 600 of JP 2003-045517 A, however, the lead layers 3 project from a surface of the adhesive layer 4, and the strip interconnects 61 also project from the surface of the substrate 6, so that the surfaces of the adhesive layer 4 and the substrate 6 are not tightly adhered and bonded to each other, resulting in low bonding strength (FIG. 6B).

To cope with it, in the electric connection member 500 and the electrode substrate 600, a metal nano-ink (which refers to an ink that contains metal nanoparticles and can sinter at low temperature) is applied onto the lead layers 3 and sintered between the lead layers 3 and the strip interconnects 61 at low temperature, thereby increasing the bonding strength.

When a metal nano-ink 15 is applied onto surfaces of the lead layers 3 projecting from the adhesive layer 4, however, upon pressing the electric connection member 500 against the electrode substrate 600, the metal nano-ink 15 may flow out between the adhesive layer 4 and the substrate 6 (FIG. 5), and adjacent lead layers 3 may be short-circuited through a conductive thin film formed by sintering. In addition, when an encapsulated metal nano-ink described in JP 2014-184381 A is used as the metal nano-ink, the metal nano-ink may be scattered as capsules are broken, which may lead to a short circuit of adjacent lead layers 3.

SUMMARY OF THE INVENTION

An object of the invention is therefore to provide an electric connection member that has high bonding strength and is free from the risk of short circuit of adjacent electrodes.

The present inventors have made an intensive study to achieve the object and as a result found that, using an electric connection member which comprises a substrate, an insulating adhesive layer provided on the substrate, and a conductive interconnect and which is configured such that the electric connection member is provided with a recess that opens at a side of the insulating adhesive layer, the conductive interconnect is disposed in the recess, a metal nano-ink is disposed on the conductive interconnect, and all of the metal nano-ink is contained inside the recess, when the electric connection member is pressed against a connection target, a projecting electrode of the connection target is inserted into the recess of the electric connection member of the invention, and a low temperature sintering reaction of the metal nano-ink occurs, whereby the electrode of the connection target is connected to the conductive interconnect and also the surfaces of the connection target and the insulating adhesive layer are tightly adhered and bonded to each other, thus achieving high bonding strength. In addition, since the metal nano-ink is disposed in the recess, even when the electric connection member is pressed against the connection target, the metal nano-ink is prevented from flowing out between the insulating adhesive layer and the connection target, and even when an encapsulated metal nano-ink is used as the metal nano-ink, the metal nano-ink is prevented from scattering upon breaking of capsules, thus preventing adjacent electrodes from being short-circuited. The invention has been thus completed.

Specifically, the present invention provides the following (1) to (10).

(1) An electric connection member comprising a substrate, an insulating adhesive layer provided on the substrate, and a conductive interconnect, wherein the electric connection member is provided with a recess that opens at a side of the insulating adhesive layer, the conductive interconnect is disposed in the recess,
a metal nano-ink is disposed on the conductive interconnect, and
all of the metal nano-ink is contained inside the recess.
(2) The electric connection member according to (1), wherein the metal nano-ink is an encapsulated metal nano-ink that has a plurality of metal nanoparticles covered by a protective agent in a capsule and that forms a conductive thin film upon breaking of the capsule by means of external stimulus.
(3) The electric connection member according to (2), wherein the conductive thin film is formed by breaking the capsule and performing heat treatment at a temperature of less than 200° C.
(4) The electric connection member according to (2) or (3), wherein the protective agent is an amphiphilic molecule, the plurality of metal nanoparticles are dispersed in a hydrophobic organic solvent, and the capsule is composed of a hydrophilic compound derivative.
(5) The electric connection member according to (4), wherein the hydrophobic organic solvent has an n-octanol/water partition coefficient of not less than 2.
(6) The electric connection member according to (4) or (5), wherein the hydrophilic compound derivative has a contact angle of not more than 90° with respect to water.
(7) The electric connection member according to any one of (4) to (6), wherein the amphiphilic molecule has a hydrophile-lipophile balance value of 0 to 13.
(8) The electric connection member according to any one of (1) to (7), wherein the substrate is a flexible substrate.
(9) A mounting structure of an electronic component assembly in which an electronic component having an electrode is mounted on the electric connection member according to any one of (1) to (8), wherein the conductive interconnect and the electrode are joined to each other by sintering the metal nano-ink in the recess of the insulating adhesive layer, and a surface of the insulating adhesive layer adheres to a surface of the electronic component.
(10) An intermediate member used for producing the electric connection member according to any one of (1) to (8), the intermediate member comprising a substrate, an insulating adhesive layer provided on the substrate, and a conductive interconnect,
wherein the intermediate member is provided with a recess that opens at a side of the insulating adhesive layer, and
the conductive interconnect is disposed in the recess.

The present invention can provide an electric connection member that, when connected to a connection target having an electrode, exhibits high bonding strength and is free from the risk of short circuit of adjacent electrodes.

BRIEF DESCRIPTION OF THE DRAWINGS

FIGS. 1A-1F are schematic views showing an electric connection member and mounting structures of electronic component assemblies according to the present invention. FIG. 1A is a perspective view of an electric connection member 100 of the invention, and FIG. 1B is a cross-sectional view thereof. FIG. 1C is a cross-sectional view of the electric connection member 100 and an electronic component 200. FIG. 1D is a cross-sectional view of an electronic component assembly in which the electric connection member 100 is connected to the electronic component 200. FIG. 1E is a cross-sectional view of the electric connection member 100 and an electronic component 200 with a plurality of electrodes 214 different in thickness. FIG. 1F is a cross-sectional view of an electronic component assembly in which the electric connection member 100 is connected to the electronic component 200 having the electrodes 214 different in thickness.

FIG. 2A is a perspective view of an intermediate member 101, and FIG. 2B is a cross-sectional view thereof. FIGS. 2C and 2D are exemplary views each showing the case where recesses 113 penetrate through an insulating adhesive layer 112.

FIG. 4A is a schematic view showing the encapsulated metal nano-ink, FIG. 4B is a photograph showing an exemplary encapsulated metal nano-ink actually manufactured, and FIG. 4C is a scanning electron micrograph of an edge portion of a thin film formed when capsules of an encapsulated metal nano-ink are broken (as observed at an accelerating voltage of 5 kV using JSM-6301F available from JEOL Ltd.).

DETAILED DESCRIPTION OF THE INVENTION

Figure 2A:
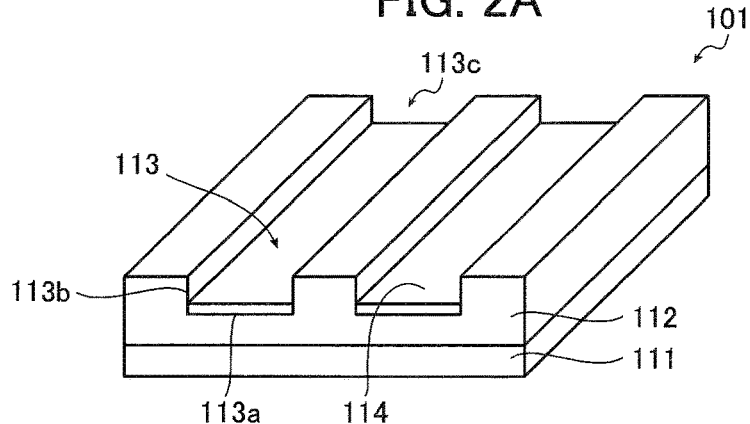
FIGS. 2A-2D are schematic views showing intermediate members used for producing the electric connection member of the invention.

An electric connection member, a mounting structure of an electronic component assembly, and an intermediate member used for producing an electric connection member according to the invention are described in detail below based on the drawings.
1. Electric Connection Member and Mounting Structure of Electronic Component Assembly
1.1) Electric Connection Member An electric connection member of the invention comprises a substrate, an insulating adhesive layer provided on the substrate, and a conductive interconnect, and is configured such that the electric connection member is provided with a recess that opens at the insulating adhesive layer side, the conductive interconnect is disposed in the recess, a metal nano-ink is disposed on the conductive interconnect, and all of the metal nano-ink is contained inside the recess.

An example of the electric connection member of the invention is described based on FIGS. 1A and 1B.

FIG. 1A is a perspective view of an electric connection member 100 of the invention, and FIG. 1B is a cross-sectional view thereof.

In the electric connection member 100 shown in FIGS. 1A and 1B, an insulating adhesive layer 112 is provided on a substrate 111.

The electric connection member 100 is provided with recesses 113 that open at a surface on the insulating adhesive layer 112 side. Each of the recesses 113 has a bottom 113a, a lateral wall 113b and an opening 113c. The recess 113 has a depth less than the thickness of the insulating adhesive layer 112. More specifically, the bottom 113a is located closer to the substrate 111 than the plane at the same level as that of the surface of the insulating adhesive layer 112 opposite from the substrate 111 side is, and closer to the surface of the insulating adhesive layer 112 opposite from the substrate 111 side than the plane at the same level as that of the interface between the insulating adhesive layer 112 and the substrate 111 is. The size of the recess 113, i.e., the depth of the recess 113 and the size of the opening 113c are determined such that the recess 113 fits with a corresponding electrode 214 of an electronic component 200 which is a connection target. The depth of the recess 113 refers to a distance from the plane at the same level as that of the surface of the insulating adhesive layer 112 opposite from the substrate 111 side to the bottom 113a in the opening 113c.

Conductive interconnects 114 are disposed in the recesses 113. More specifically, the conductive interconnects 114 are disposed on the bottoms 113a of the recesses 113.

A metal nano-ink 115 (or encapsulated metal nano-ink 115a) is disposed on the conductive interconnects 114. All of the metal nano-ink 115 is contained inside the recesses 113. In other words, the surface of a layer formed of the metal nano-ink 115 (or encapsulated metal nano-ink 115a) opposite from the conductive interconnect 114 side is lower than the surface of the insulating adhesive layer 112. The total thickness of the conductive interconnect 114 and the layer formed of the metal nano-ink 115 (or encapsulated metal nano-ink 115a) is less than the depth of the recess 113.

Whether an electric connection member has the foregoing configuration or not can be determined by observing the shape of the electric connection member. In particular, this can be determined by checking as to whether a metal nano-ink or an encapsulated metal nano-ink, or sintered metal particles are present in a recess on an insulating adhesive layer side. In addition, when this electric connection member is determined to have the configuration of an intermediate member to be described later as a result of observation of the shape, the intermediate member can be determined to be the one used only for producing the electric connection member of the invention or the one which is used for producing the electric connection member of the invention and is essential in achieving the object by the invention.

The substrate, insulating adhesive layer and conductive interconnect of the electric connection member of the invention are described below. The metal nano-ink will be described later in "5. Metal Nano-Ink."

1.1.1) Substrate

While the substrate 111 of the electric connection member may be any of a rigid substrate, a rigid-flexible substrate and a flexible substrate, a flexible substrate is preferred because of its high flexural endurance.

A material forming the substrate 111 of the electric connection member is preferably, but not necessarily, a resin material. Examples of such a resin material include polyethylene terephthalate, polyethylene, polypropylene, polycarbonate, polymethyl acrylate, polyfluoroethylene, ABS resin, nylon, acetal resin, vinyl chloride resin, epoxy resin, melamine resin and phenolic resin. A resin material may be suitably selected in view of various conditions such as flexibility, mechanical strength, heat resistance and price.

An organic or inorganic filler or void may be added to a material forming the substrate 111 of the electric connection member. Although not particularly limited, exemplary organic fillers include acrylic and urethane polymer particles, exemplary inorganic fillers include silica, alumina, zirconia and calcium carbonate particles, exemplary organic voids include organic microballoons whose outer shells are formed of a thermoplastic resin, a phenolic resin or the like, and exemplary inorganic voids include inorganic microballoons whose outer shells are formed of silica, alumina, zirconia, Shirasu or the like.

The thickness of the substrate 111 of the electric connection member is not particularly limited, and a thickness of less than 10 μm is not preferred because the strength of the substrate (film) would be insufficient, while a thickness of greater than 250 μm is not preferred because the substrate (film) would have too high stiffness and when the substrate 111 is connected to a member with three-dimensional irregularities, such stiffness results in lower conformability to the irregularities.

1.1.2) Insulating Adhesive Layer

The insulating adhesive layer 112 of the electric connection member can be used repeatedly or in permanent connection depending on the type of an insulating adhesive forming the layer 112.

An insulating adhesive forming the insulating adhesive layer 112 of the electric connection member may be an adhesive material or a pressure-sensitive adhesive material and is not particularly limited. Examples thereof include polyester, polyurethane, acrylic, epoxy, phenol, silicon, polyolefin, polyimide, vinyl and natural polymers. The polymers above may be used alone or in combination of two or more.

In order to enhance adhesion and mechanical and thermal properties, the polymer above may be mixed with, for instance, any of polyester, polyurethane, acrylic, epoxy, phenol, silicon, polyolefin, polyimide and vinyl monomers and oligomers.

The weight-average molecular weight of the polymer above is not particularly limited, and is preferably not less than 100,000 and more preferably in a range of 500,000 to 1,000,000 because heat resistance and cohesion at high temperature can be improved, thereby reducing the occurrence of peeling and the generation of air bubbles.

The dielectric constant of the insulating adhesive is not particularly limited. When the conductive interconnect is formed in the recess of the insulating adhesive layer, upon pressing an electronic component against the electric connection member, an electrode of the electronic component and the conductive interconnect of the electric connection member are to be covered by the insulating adhesive, and therefore the insulating adhesive is preferably a material with a low dielectric constant. For example, the dielectric constant is not more than 4 and the dissipation factor is not more than 0.1 at 1 GHz and 25° C. More preferably, the dielectric constant is not more than 3 and the dissipation factor is not more than 0.01. Even more preferably, the dielectric constant is not more than 2 and the dissipation factor is not more than 0.001.

The storage modulus of the insulating adhesive is not particularly limited, and is in a range preferably of $10^3$ Pa to $10^6$ Pa and more preferably of $10^4$ Pa to $10^5$ Pa. When the storage modulus is in the above-defined range, an adhesive can have improved fluidity and hence, the adhesion and the bending behavior are improved, while the stress applied to a connected portion in expansion and contraction behavior can be relaxed, so that the adhesive can have improved resistance to bonding breakage, thus leading to improved adhesion.

The insulating adhesive is preferably a reactive adhesive composition containing a polymerizable compound. Such a composition makes it possible to connect the electric connection member to a member to be mounted with the optimal adhesion strength.

Examples of such a polymerizable compound include radically polymerizable compounds and cationically polymerizable compounds. A polymerizable compound is not limited as long as it becomes a high molecular weight compound through polymerization reaction and as a result improves the adhesion to a material to be mounted, and may be a monomer or an oligomer.

Examples of radically polymerizable compounds include radically polymerizable compounds each having a radically polymerizable functional group, such as monofunctional and multifunctional acrylates, maleimide, thiol and vinyl ether.

Examples of cationically polymerizable compounds include cationically polymerizable compounds each having a cationically photopolymerizable functional group, such as epoxy, oxetane and vinyl ether.

The radically polymerizable compounds and cationically polymerizable compounds above may be used alone or in combination of two or more.

The polymerizable compound content of an adhesive composition is not particularly limited, and is in a range preferably of 10 mass % to 80 mass % and more preferably of 30 mass % to 60 mass % of the adhesive composition. When the polymerizable compound content is in the above-defined range, the storage modulus after curing is small and the shock resistance is improved, so that the insulating adhesive layer is not easily broken at low temperature, while a cohesive force after curing is sufficiently improved and hence, the adhesion and the heat resistance are improved.

Examples of a polymerization initiator for a polymerizable compound include radical polymerization initiators that are activated by external energy such as light or heat to generate radicals, and cationic polymerization initiators that generate cations. The polymerization initiators above may be used alone or in combination of two or more.

The radical polymerization initiator is not particularly limited as long as it enables radical polymerization of a radically polymerizable compound to proceed with relatively low energy, and examples thereof include radical polymerization initiators that generate a starting radical with a single molecule and radical polymerization initiators that generate a radical through reaction between two molecules.

Examples of polymerization initiators that generate a starting radical with a single molecule include compounds such as acetophenone, acylphosphine, titanocene, tyrodine and bisimidazole.

Examples of polymerization initiators that generate a radical through reaction between two molecules include compounds such as benzophenone, amine and thioxanthone.

The cationic polymerization initiator is not particularly limited as long as it enables a cationically polymerizable compound to be polymerized with relatively low energy, and examples thereof include ionic acid-generating cationic polymerization initiators and non-ionic acid-generating cationic polymerization initiators.

Examples of ionic acid-generating cationic polymerization initiators include compounds such as iodonium salt and sulfonium salt.

Examples of non-ionic acid-generating cationic polymerization initiators include compounds such as sulfonyl diazomethane, oxime sulfonate, imide sulfonate and nitrobenzyl sulfonate.

The amount of added polymerization initiator is not particularly limited and may be suitably set according to the reactivity of a polymerizable compound, the amount of molecules, the viscoelasticity desired to be imparted to an adhesive layer, and other factors. More specifically, the amount of added polymerization initiator is set to be in a range preferably of 0.001 to 10 mass % and more preferably of 0.1 to 5 mass % with respect to the total weight of polymerization compound(s). When the amount of polymerization initiator is in the above-defined range, the reactivity of the adhesive composition is sufficiently low, so that curing by external energy such as light or heat proceeds at moderate speed and the operation is not hampered, while problems should not occur such as insufficient curing and decreased curing rate.

In addition, particles made of an inorganic oxide, a resin or the like may be dispersed in the adhesive composition in order to improve, for instance, thermal and mechanical properties. The particles made of an inorganic oxide is not particularly limited, and examples thereof include particles made of metal oxides such as silica and alumina. Examples of particles made of a resin include particles made of synthetic resins such as acrylic resin, styrene resin, fluororesin and silicone.

The method of providing the insulating adhesive layer on the substrate is not particularly limited, and exemplary methods include various methods using coating devices such as a comma coater, various printing methods such as gravure printing, and methods using a dispenser or a spray.

1.1.3) Conductive Interconnect

Examples of a conductive material that may be used to form the conductive interconnects 114 include metal materials such as copper, silver, gold, platinum, carbon, nickel, palladium, rhodium, ruthenium and indium. The metals above may be used alone or in combination of two or more. Conductive particles may be plated and be in a spherical, chain or flake-like shape. Use may be made of a conductive interconnect formed by printing a substance in which the conductive material above is dispersed in a binder resin such as urethane resin by a certain printing process, followed by baking.

A conductive interconnect formed by using a metal nano-ink to be described in "5. Metal Nano-Ink" below is also preferable.

The width and thickness of the conductive interconnect 114 are not particularly limited as long as the conductive interconnect 114 can be disposed in the recess 113. More specifically, the conductive interconnect 114 is not greater in width than the recess 113. The width of the conductive interconnect 114 is preferably not less than 1 μm because the manufacture thereof can be easier, and more preferably not less than 5 μm and even more preferably not less than 10 μm in order to reduce the amount of flowing current per unit volume. The thickness of the conductive interconnect 114 is less than the depth of the recess 113.

Exemplary methods of providing the conductive interconnect 114 in the recess 113 of the electric connection member 100 include various methods using coating devices such as a comma coater, various printing methods such as gravure printing, and methods using a dispenser or a spray.

1.2) Mounting Structure of Electronic Component Assembly

The mounting structure of an electronic component assembly according to the invention is a mounting structure of an electronic component assembly in which an electronic component having an electrode is mounted on the electric connection member of the invention and is configured such that the conductive interconnect and the electrode are joined to each other by sintering a metal nano-ink in the recess of the insulating adhesive layer, and a surface of the insulating adhesive layer adheres to a surface of the electronic component.

One example of the mounting structure of an electronic component assembly according to the invention is described below based on FIGS. 1C to 1F.

FIG. 1C is a cross-sectional view of the electric connection member 100 and an electronic component 200. FIG. 1D is a cross-sectional view of an electronic component assembly in which the electric connection member 100 is connected to the electronic component 200. FIG. 1E is a cross-sectional view of the electric connection member 100 and an electronic component 200 with a plurality of electrodes 214 different in thickness. FIG. 1F is a cross-sectional view of an electronic component assembly in which the electric connection member 100 is connected to the electronic component 200 having the electrodes 214 different in thickness.

The mounting structure of an electronic component assembly in which an electronic component having an electrode is mounted on the electric connection member of the invention is described.

The electric connection member 100 is as described in "1.1) Electric Connection Member."

In an electronic component 200, electrodes 214 are disposed on a substrate 211. Each of the electrodes 214 of the electronic component 200 is less in width than the recess 113 of the electric connection member 100 so that the electrode 214 can fit in the corresponding recess 113. A distance d1 from the plane at the same level as that of the surface of the insulating adhesive layer 112 opposite from the substrate 111 side to the upper surface of the conductive interconnect 114 in the opening 113c of the recess 113 of the electric connection member 100 is set to be less than the thickness d2 of the electrode 214 of the electronic component 200.

When the electric connection member 100 is connected to the electronic component 200, as shown in FIG. 1C, the electrodes 214 of the electronic component 200 are fitted into the corresponding recesses 113, and the electrodes 214 of the electronic component 200 are pressed against the conductive interconnects 114. Thus, the electric connection member 100 and the electronic component 200 are connected to each other as shown in FIG. 1D. At this time, as shown in FIG. 1D, the insulating adhesive layer 112 adheres to the substrate 211, thereby establishing mechanical bonding.

When pressed, the insulating adhesive layer 112 of the electric connection member 100 elastically deforms and adheres to the substrate 211 of the electronic component 200, and in addition, an elastic restoring force acts on the substrate 111 of the electric connection member 100 as a load exerted in a direction in which the substrate 211 of the electronic component 200 is pressed, thus establishing stable electrical connection between the electric connection member 100 and the electronic component 200. This electric connection member 100 is configured to have a mechanical connecting and fixing structure using an insulating adhesive layer, and accordingly, can be fixed in a thin shape with a simple structure and without the need for a dedicated fixing jig.

Figure 3A:
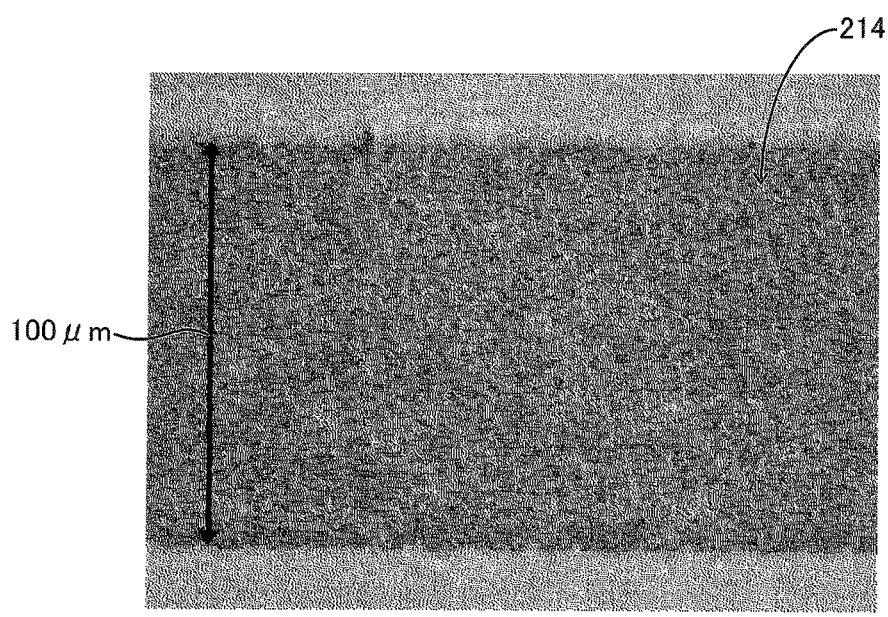
FIG. 3A is a laser micrograph showing an example of a surface condition of an electrode 214 of an electronic component 200.

When a surface of the electrode 214 has the arithmetic mean roughness (Ra), even when the electrode 214 is apparently in surface contact with the conductive interconnect 114, the contact is actually made up of point contacts, and there are many portions making no contact, that is, many micro gaps. Such micro gaps are filled with the metal nano-ink 115 or a metal nano-ink discharged by breaking capsules of the encapsulated metal nano-ink 115a, which is subsequently sintered to form a conductive thin film 116, whereby good electrical connection between the electrodes 214 and the conductive interconnects 114 can be ensured. A laser micrograph is shown in FIG. 3 as an example of an electrical connection surface condition of the electrode 214 of the electronic component 200.

Even when the plurality of electrodes 214 of the electronic component 200 are different in thickness as shown in FIGS. 1E and 1F, gaps between the electrodes 214 and the conductive interconnects 114 are filled with the metal nano-ink 115 (or encapsulated metal nano-ink 115a) disposed on the conductive interconnects 114, which is sintered to form the conductive thin films 116, whereby good electrical connection between the electrodes 214 and the conductive interconnects 114 can be ensured.

Whether a mounting structure of an electronic component assembly has the foregoing configuration or not can be determined by detaching an electronic component and observing the component in destructive inspection. In particular, it is preferable to confirm a sign of the connection between a conductive interconnect and an electrode via sintered metal particles in a recess located on an insulating adhesive layer side.

1.2.1) Electronic Component

The electronic component 200 includes the substrate 211 and the electrodes 214 disposed thereon.

1.2.1.1) Substrate

For the substrate 211 of the electronic component 200, any substrate may be used without limitation as long as it is for use in surface mounting type electronic devices. For instance, a substrate of the same type as the substrate 111 of the electric connection member 100 as above may be used.

1.2.1.2) Electrode

For the electrode 214 of the electronic component 200, any electrode may be used without limitation as long as it is for use in surface mounting type electronic devices. For instance, an electrode of the same type as the conductive interconnect 114 of the electric connection member 100 as above may be used.

The type of the electronic component 200 is not particularly limited, and examples thereof include a large scale integration (LSI), an integrated circuit (IC), a liquid crystal display, a transistor, a diode, a light emitting diode (LED), a transistor and a capacitor.

The electronic component 200 is preferably a surface mounting type electronic component.

2. Intermediate Member Used for Producing Electric Connection Member

An intermediate member used for producing the electric connection member of the invention (also simply referred to as "intermediate member of the invention" or "intermediate member") comprises a substrate, an insulating adhesive layer provided on the substrate, and a conductive interconnect, and is configured such that the intermediate member is provided with a recess that opens at the insulating adhesive layer side, and the conductive interconnect is disposed in the recess.

An example of the intermediate member of the invention is described below based on FIGS. 2A to 2D.

Figure 2B:
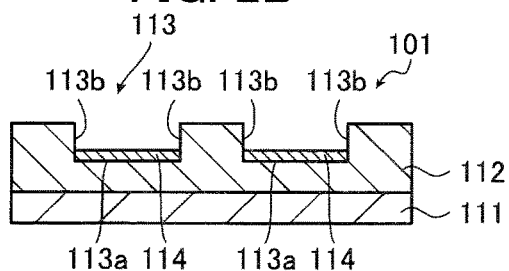

FIG. 2A is a perspective view of an intermediate member 101 of the invention, and FIG. 2B is a cross-sectional view thereof.

In the intermediate member 101 shown in FIGS. 2A and 2B, an insulating adhesive layer 112 is provided on a substrate 111.

The intermediate member 101 is provided with recesses 113 that open at a surface on the insulating adhesive layer 112 side. Each of the recesses 113 has a bottom 113a, a lateral wall 113b and an opening 113c. The recess 113 has a depth less than the thickness of the insulating adhesive layer 112. More specifically, the bottom 113a is located closer to the substrate 111 than the plane at the same level as that of the surface of the insulating adhesive layer 112 opposite from the substrate 111 side is, and closer to the surface of the insulating adhesive layer 112 opposite from the substrate 111 side than the plane at the same level as that of the interface between the insulating adhesive layer 112 and the substrate 111 is. The size of the recess 113, i.e., the depth of the recess 113 and the size of the opening 113c are determined such that the recess 113 fits with a corresponding electrode 214 of an electronic component 200 which is a connection target of the electric connection member 100 produced using the intermediate member 101. The depth of the recess 113 is a distance from the plane at the same level as that of the surface of the insulating adhesive layer 112 opposite from the substrate 111 side to the bottom 113a in the opening 113c.

Conductive interconnects 114 are disposed in the recesses 113. More specifically, the conductive interconnects 114 are disposed on the bottoms 113a of the recesses 113.

The thickness of the conductive interconnect 114 is less than the depth of the recess 113.

While the recess 113 has a depth less than the thickness of the insulating adhesive layer 112 in an example shown in FIGS. 2A and 2B, in the intermediate member 101 of the invention, the depth of the recess 113 may be greater than the thickness of the insulating adhesive layer 112 as long as the recess 113 does not penetrate through the substrate 111.

Figure 2C:
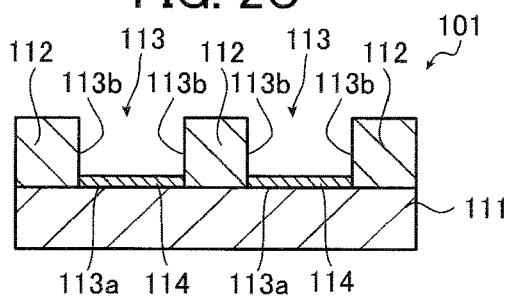

FIG. 2C shows an example of the case where bottoms 113a of recesses 113 are located at the same level as that of the interface between the insulating adhesive layer 112 and the substrate 111, in other words, the surface of the substrate 111 on the insulating adhesive layer 112 side is exposed at the bottoms 113a.

Figure 2D:
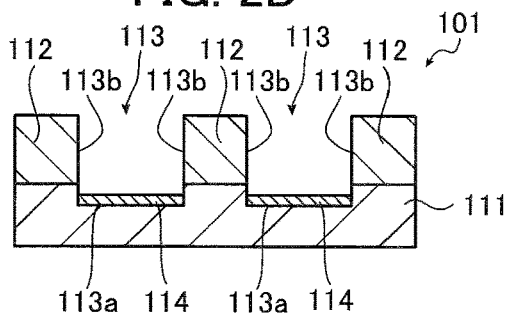

FIG. 2D shows an example of the case where bottoms 113a of recesses 113 are located close to the surface of the substrate 111 opposite from the insulating adhesive layer 112 side beyond the plane at the same level as that of the interface between the insulating adhesive layer 112 and the substrate 111, in other words, the recesses 113 are each formed of the combination of a hole penetrating through the insulating adhesive layer 112 and a recess that opens at the surface of the substrate 111 on the insulating adhesive layer 112 side and is integral with the hole.

Whether an intermediate member has the foregoing configuration or not can be determined by observing the shape of the intermediate member.

The intermediate member of the invention is used for producing the electric connection member of the invention and alternatively, may be included in a set with a metal nano-ink or an encapsulated metal nano-ink, for example. To be more specific, instead of the electric connection member of the invention, a set of the intermediate member of the invention and a metal nano-ink or an encapsulated metal nano-ink may be for example provided to a consumer so that the consumer can produce the electric connection member of the invention.

3. Electric Connection Member and Intermediate Member

The electric connection member 100 of the invention is obtained by disposing the metal nano-ink 115 (or encapsulated metal nano-ink 115a) on the conductive interconnects 114 of the intermediate member 101, and all of the metal nano-ink 115 (or encapsulated metal nano-ink 115a) is contained inside the recesses 113.

Since all of the metal nano-ink 115 (or encapsulated metal nano-ink 115a) is contained inside the recesses 113, the surfaces of the layers formed of the metal nano-ink 115 (or encapsulated metal nano-ink 115a) disposed on the conductive interconnects 114, opposite from the conductive interconnect 114 side are located closer to the substrate 111 than the plane at the same level as that of the surface of the insulating adhesive layer 112 opposite from the substrate 111 side is.

The method of producing the intermediate member 101 is not particularly limited. For instance, the intermediate member 101 of the invention may be produced by disposing or overlaying the insulating adhesive layer 112 having the recesses 113 onto the substrate 111. Alternatively, for example, the intermediate member 101 may be produced by first disposing or overlaying the insulating adhesive layer 112 onto the substrate 111 to make a laminated or coated body and then forming the recesses 113 from the insulating adhesive layer 112 side of the laminated or coated body by cutting or another process. Still alternatively, for example, the intermediate member 101 may be produced by disposing or overlaying the insulating adhesive layer 112 onto raised portions of the substrate 111 having irregularities to thereby form the recesses 113 opening in the insulating adhesive layer 112.

The electric connection member 100 of the invention can be produced by disposing the metal nano-ink 115 (or encapsulated metal nano-ink 115a) or forming a layer of the metal nano-ink 115 (or encapsulated metal nano-ink 115a) on each conductive interconnect 114 of the intermediate member 101.

Exemplary methods of disposing the metal nano-ink 115 (or encapsulated metal nano-ink 115a) or forming a layer of the metal nano-ink 115 (or encapsulated metal nano-ink 115a) on each conductive interconnect 114 include various methods using coating devices such as a comma coater, various printing methods such as gravure printing, and methods using a dispenser or a spray. As a method of forming a non-encapsulated metal nano-ink layer, an inkjet process is also preferably employed.

For the intermediate member 101, instead of the one in which the depth of the recess 113 is less than the thickness of the insulating adhesive layer 112 as shown in FIGS. 2A and 2B, the intermediate member 101 in which the depth of the recess 113 is the same as the thickness of the insulating adhesive layer 112 as shown in FIG. 2C may be used. In this case, the bottom 113a of the recess 113 of the electric connection member 100 of the invention is located at the same level as that of the interface between the insulating adhesive layer 112 and the substrate 111.

For the intermediate member 101, instead of the one in which the depth of the recess 113 is less than the thickness of the insulating adhesive layer 112 as shown in FIGS. 2A and 2B, the intermediate member 101 in which the depth of the recess 113 is greater than the thickness of the insulating adhesive layer 112 as shown in FIG. 2D may be used. In this case, the bottom 113a of the recess 113 of the electric connection member 100 of the invention is located close to the surface of the substrate 111 opposite from the insulating adhesive layer 112 side beyond the plane at the same level as that of the interface between the insulating adhesive layer 112 and the substrate 111.

The recesses 113 are provided at two locations in FIGS. 2A to 2D but may be provided at one or three or more locations as necessary.

With the depth of the recesses 113 being less than the thickness of the insulating adhesive layer 112 and the encapsulated metal nano-ink 115a being used as the metal nano-ink 115, by forming the conductive interconnects 114 having higher hardness than that of the insulating adhesive layer 112 on the bottoms 113a of the recesses 113, that is, between the insulating adhesive layer 112 and layers formed of the encapsulated metal nano-ink 115a, when a pressing force is applied to break capsules of the encapsulated metal nano-ink 115a, a less portion of the force is absorbed by the insulating adhesive layer 112, so that the capsules can be sufficiently broken. Therefore, it is preferable that the depth of the recesses 113 be less than the thickness of the insulating adhesive layer 112.

4. Advantages of Present Invention over Conventional Art

Advantages of the electric connection member of the invention over conventional electric connection members are described.

When the electric connection member of the invention is pressed against a connection target such as an electronic component, a projecting electrode of the connection target is inserted into the recess of the electric connection member on the insulating adhesive layer side, and a low temperature sintering reaction of the metal nano-ink occurs, whereby not only the electrode of the connection target is connected to the conductive interconnect of the electric connection member but also the surface of a substrate of the connection target on the electrode side and the surface of the electric connection member on the insulating adhesive layer side are tightly adhered and bonded to each other, thus achieving high bonding strength.

In the electric connection member of the invention, since the metal nano-ink (or encapsulated metal nano-ink) is disposed in the recess, even when the electric connection member is pressed against a connection target, the metal nano-ink is prevented from flowing out between the insulating adhesive layer and the connection target, and in the case where the encapsulated metal nano-ink is used, the metal nano-ink is prevented from scattering upon breaking of capsules, thus preventing adjacent electrodes from being short-circuited.

5. Metal Nano-Ink

Examples of the metal nano-ink include a dispersion of coated ultrafine silver particles described in JP 2010-265543 A, a dispersion of coated fine copper particles described in JP 2012-72418 A, a dispersion of coated fine metal particles described in JP 2012-162767 A, a dispersion of coated fine silver particles described in JP 2014-31542 A, a dispersion of coated fine silver particles described in JP 2014-40630 A, and a dispersion of coated ultrafine silver particles described in WO 2011/119630; however, the metal nano-ink is not limited thereto and metal nano-inks described below may be suitably used.

5.1) Ingredients of Metal Nano-Ink

The metal nano-ink is a low temperature sintering ink comprising metal nanoparticles, a protective agent and a solvent, and is configured such that the protective agent is desorbed from the metal nanoparticles as the solvent evaporates in a room temperature environment, thereby providing a conductive thin film.

5.1.1) Metal Nanoparticle

The type of the metal nanoparticles above is not particularly limited, and examples thereof include nanoparticles of metals such as gold, silver, copper, platinum, palladium, rhodium, ruthenium, iridium and osmium. Those metals may be used alone or in combination of two or more.

Applicable are metal nanoparticles produced by various known methods such as laser ablation, chemical reduction, a process involving subjecting an organic metal compound to pyrolysis, a process involving reducing a metal chloride in a gas phase, and a process involving reducing an oxide in water.

Metal nanoparticles stabilized by the protective agent and dispersed in the solvent can be obtained through chemical reduction, and thus use of metal nanoparticles synthesized by chemical reduction is particularly preferred.

The average secondary particle size of the metal nanoparticles above is not particularly limited, and is in a range preferably of 1 to 500 nm, more preferably of 1 to 100 nm, still more preferably of 1 to 50 nm, and even more preferably of 1 to 30 nm. When the average secondary particle size is in the above-defined range, the metal nanoparticles can be easily stabilized by the protective agent in the solvent, and sintering temperature can be lowered. The average secondary particle size is measured by dynamic light scattering or laser diffraction. The average secondary particle size of metal nanoparticles in an encapsulated metal nano-ink may be measured by, for instance, placing the encapsulated metal nano-ink in a suitable organic solvent (which may be hexan, octane, acetonitrile or the like and is preferably the same substance as the solvent of the metal nano-ink in capsules), breaking capsules in the organic solvent to dilute the metal nano-ink having been encapsulated, separating capsule residue from a diluted solution by filtration or the like, and subjecting the obtained diluted solution to dynamic light scattering or laser diffraction.

5.1.2) Protective Agent

The protective agent above is not particularly limited as long as it can ensure the dispersibility of the metal nanoparticles in the solvent, and is preferably an amphiphilic molecule (which is a generic term referring to molecules each containing both of "hydrophilic group" having affinity for water (aqueous phase) and "lipophilic group" (hydrophobic group) having affinity for oil (organic phase) in the molecule). The hydrophile-lipophile balance (HLB) value of an amphiphilic molecule (which refers to the degree of affinity of the amphiphilic molecule for water and oil (water-insoluble organic compound)) is preferably 0 to 13, more preferably 0 to 8, still more preferably 0 to 6, and even more preferably 0 to 3. When the solvent is a hydrophobic organic solvent, a smaller HLB value is preferred. The HLB value is obtained by identifying the protective agent and using the Griffin's method.

Applicable examples of methods for identifying the protective agent include methods generally used in organic analysis, such as a nuclear magnetic resonance method, various chromatography analyses, various spectroscopic analyses and various mass spectrometry methods. For instance, the protective agent can be identified by subjecting the metal nano-ink or a diluted solution thereof to gas chromatography-mass spectrometry (GC-MS).

The amphiphilic molecule is preferably at least one selected from the group consisting of alkylamines, sorbitan fatty acid ester, polyglycerol fatty acid ester, mercaptan, phosphate ester, aliphatic phosphorus oxide, alkyl amine fatty acid salt, polypropylene oxide fatty acid ether, thiol and succinic acid derivatives. Of these, alkylamines are preferred because these lead to excellent low temperature sintering properties and excellent dispersibility of nanoparticles in the solvent. Alkylamine for use may be any of long-chain alkylamine, medium-chain alkylamine and short-chain alkylamine. Alkylamines may be used alone or in combination of two or more. Examples of long-chain alkylamines (in which an alkyl group contains 15 or more carbon atoms) include oleylamine ($C_{18}H_{37}N$); examples of medium-chain alkylamines (in which an alkyl group contains 6 to 10 carbon atoms) include octylamine ($C_8H_{19}N$) and hexylamine ($C_6H_{15}N$); and examples of short-chain alkylamines (in which an alkyl group contains 1 to 5 carbon atoms) include butylamine ($C_4H_{11}N$).

5.1.3) Solvent

The solvent above is not particularly limited as long as it can stably disperse the metal nanoparticles covered by the protective agent, and is preferably a hydrophobic organic solvent. The hydrophobic organic solvent preferably has an n-octanol/water partition coefficient of not less than 2 (where, when a chemical substance is dissolved in a liquid having two layers of an organic solvent (n-octanol) and water, and the liquid is at equilibrium, the ratio between the amounts of the chemical substance dissolved in the respective solutions is called "partition coefficient" and represented by a logarithmic value). In this specification, the n-octanol/water partition coefficient ($Log_{10}P_{OW}$) is measured according to JIS Z 7260-117:2006 "Partition coefficient (1-octanol/water)."

Examples of the hydrophobic organic solvent include: aromatic hydrocarbons such as benzene, o-toluene, m-toluene and p-toluene; aliphatic hydrocarbons such as n-hexane, n-heptane and n-octane; and hydrocarbon mixtures such as diethyl ether, ligroin (JIS K 8937:1994), petroleum benzine (JIS K 8534:1996) and petroleum ether (JIS K 8593:2007).

5.2) Low Temperature Sintering Metal Nano-Ink

The metal nano-ink is preferably a low temperature sintering metal nano-ink and particularly preferably a room temperature sintering metal nano-ink.

The low temperature sintering metal nano-ink is a metal nano-ink that can sinter by heat treatment at a temperature of lower than 200° C., preferably not higher than 150° C., more preferably not higher than 120° C., still more preferably not higher than 100° C., and even more preferably not higher than 50° C., to thereby form a metal film on a substrate. The room temperature sintering metal nano-ink is, among low temperature sintering metal nano-inks, a metal nano-ink that can sinter at a particularly low temperature, i.e., that can sinter at room temperature (with no heating or no cooling from an external system) without heat treatment, to thereby form a metal film on a substrate.

5.3) Encapsulated Metal Nano-Ink

The metal nano-ink is preferably an encapsulated metal nano-ink.

Figure 4A:
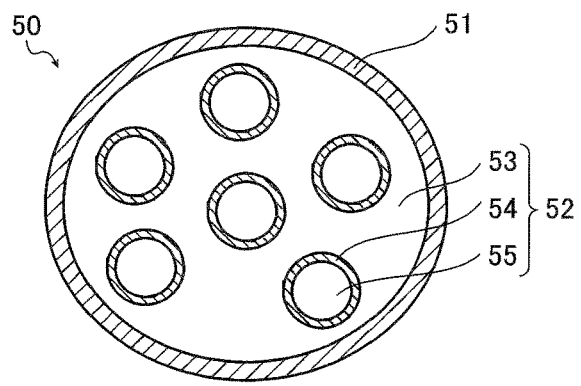
FIGS. 4A-4C are views for illustrating an encapsulated metal nano-ink used in the electric connection member of the invention.
Figure 4B:
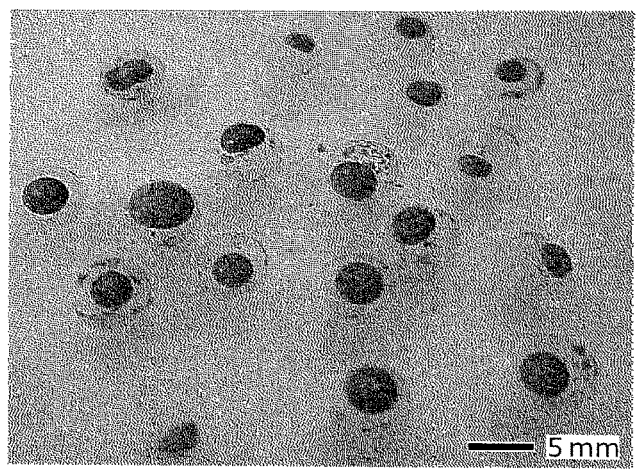
Figure 4C:
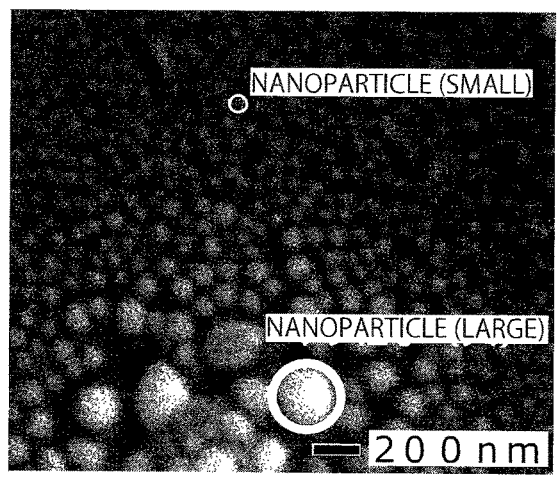
Figure 5:
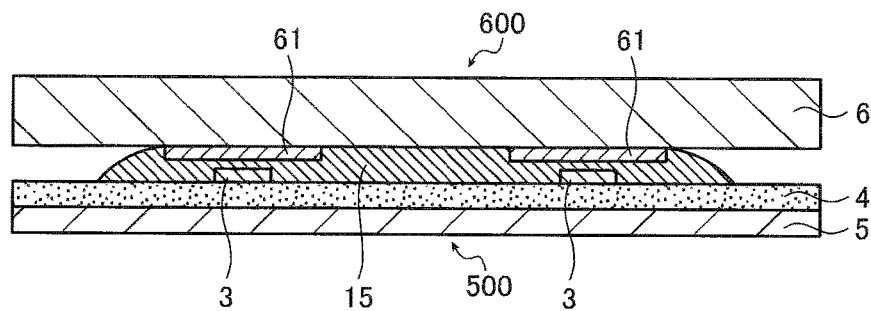
FIG. 5 is a view showing an electric connection member and an electrode substrate shown in FIG. 1(b) of JP 2003-045517 A in combination with a metal nano-ink.

The encapsulated metal nano-ink is an encapsulated metal nano-ink that has a plurality of metal nanoparticles covered by a protective agent in a capsule and that is capable of forming a conductive thin film upon breaking of the capsule by means of external stimulus. The schematic view thereof is shown in FIG. 4A. An example of an encapsulated metal nano-ink actually produced is shown in FIG. 4B.

The details of an encapsulated metal nano-ink are described in JP 2014-184381 A.

As shown in FIG. 4A, an encapsulated metal nano-ink 50 is composed of at least a metal nano-ink 52 and a capsule wall 51.

A metal nano-ink (low temperature sintering metal nano-ink) may be encapsulated by any of known methods such as interface reaction, in situ polymerization, in-liquid curing coating, phase separation and in-liquid drying, which are used as being suitably adjusted in accordance with the polarity and other properties of an ink solvent.

5.3.1) Metal Nano-Ink

The metal nano-ink 52 is a low temperature sintering ink comprising metal nanoparticles 55, a protective agent 54 and a solvent 53, and is configured such that the protective agent is desorbed from the metal nanoparticles as the solvent evaporates in a room temperature environment, thereby providing a conductive thin film.

The details of the metal nano-ink are as described above.

5.3.2) Capsule Wall

The capsule wall 51 is not particularly limited as long as it allows the metal nano-ink 52 as encapsulated to be discharged out of a capsule at desired timing. A capsule is broken for discharging an encapsulated ink out of the capsule. "Breaking" here is preferably a physical process in which, for example, a capsule deforms upon receiving pressure and is broken accordingly. Alternatively, for instance, a process involving applying heat to the extent that a metal nano-ink as encapsulated does not alter in properties to thereby dissolve a capsule is preferred. Aside from that, it is also possible to discharge an encapsulated ink out of a capsule by using, in combination, a chemical process involving changing the equilibrium state between a capsule wall and the encapsulated ink to thereby break the capsule. For example, when a capsule wall is formed of a polymer having any of spiropyrans, azobenzenes, diarylethenes and stilbenes, which are photochromic materials, in its molecular skeleton, molecules are isomerized upon irradiation with light, so that the molecular structure changes, whereby the volume and the electronic structure of the capsule wall change, which allows the degree of interaction between the capsule wall and an encapsulated ink and the mechanical strength of the capsule wall to change. Aside from that, the physical property of a capsule wall can be controlled through change in compatibility of a polymer or change in volume of a polymer accompanied with electrostatic repulsion by changing the pH around a capsule to change the ionized state of amino group, carboxy group and hydroxy group. Besides, an electric field may be applied to a capsule to induce ion transfer or oxidation reduction, whereby physicochemical properties of a capsule wall become non-uniform, which serves to change the equilibrium state. Such stimulus-responsive materials as above may directly form a capsule or may be dispersed in a capsule as an additive.

5.3.2.1) Hydrophilic Compound Derivative

The capsule wall 51 is preferably composed of a hydrophilic compound derivative. This is because, when the encapsulated metal nano-ink assumes the form of a dispersion to be described later, the dispersion can be an aqueous dispersion, leading to good handleability.

The hydrophilic compound derivative preferably has a contact angle of not more than 90° with respect to water. When the contact angle is not more than 90° with respect to water, the hydrophilicity is sufficient. In this specification, the contact angle with respect to water is measured according to JIS R 3257:1999 "Testing method of wettability of glass substrate."

Examples of the hydrophilic compound derivative include a gel of alginate obtained by crosslinking water-soluble alginate by the aid of polyvalent metal ions (e.g., $Ca^{2+}$, $Fe^{2+}$, $Fe^{3+}$ and $Al^{3+}$), a polyacrylamide gel obtained by crosslinking acrylamide, an agarose gel obtained by dissolving and then cooling agarose, a poly(meth)acrylic acid obtained by polymerizing a (meth)acrylic acid, a mixture of acrylate and a UV-reactive polymerization initiator (which mixture is irradiated with UV in encapsulation), a photoresponsive polymer in which a polymer skeleton is modified with any of spiropyrans, azobenzenes, diarylethenes and stilbenes, a pH-responsive polymer having many amino groups, carboxy groups or hydroxy groups such as polyvinylpyrrolidine and polyethyleneimine, and an electric field-responsive polymer like a gel which is formed of an ionic liquid layer and a fluororesin layer and in which ions easily move upon application of voltage. These may be used alone or in combination of two or more.

5.3.3) Solvent

The encapsulated metal nano-ink may be dispersed in a dispersion medium to form an encapsulated metal nano-ink dispersion. Owing to such a dispersion form, the encapsulated metal nano-ink can have further enhanced storage stability.

The dispersion medium above is not particularly limited, and is preferably water or a hydrophilic solvent in view of dispersion stability when a capsule is formed of a hydrophilic compound derivative.

Examples of the hydrophilic solvent above include water-soluble alcohols, ethers derived from water-soluble alcohols and esters derived from water-soluble alcohols.

The water-soluble alcohols above are preferably aliphatic alcohols having 1 to 3 hydroxy groups in the molecule, and specific examples thereof include methanol, ethanol, 1-propanol, 1-butanol, 1-pentanol, 1-hexanol, cyclohexanol, 1-heptanol, 1-octanol, 1-nonanol, 1-decanol, glycidol, methylcyclohexanol, 2-methyl-1-butanol, 3-methyl-2-butanol, 4-methyl-2-pentanol, isopropyl alcohol, 2-ethylbutanol, 2-ethylhexanol, 2-octanol, terpineol, dihydroterpineol, 2-methoxyethanol, 2-ethoxyethanol, 2-n-butoxyethanol, carbitol, ethyl carbitol, n-butyl carbitol, diacetone alcohol, ethylene glycol, diethylene glycol, triethylene glycol, tetraethylene glycol, propylene glycol, trimethylene glycol, dipropylene glycol, tripropylene glycol, 1,2-butylene glycol, 1,3-butylene glycol, 1,4-butylene glycol, pentamethylene glycol, hexylene glycol and glycerol.

Examples of the ethers derived from water-soluble alcohols above include diethyl ether, diisobutyl ether, dibutyl ether, methyl-tert-butyl ether, methylcyclohexyl ether, diethylene glycol dimethyl ether, diethylene glycol diethyl ether, triethylene glycol dimethyl ether, triethylene glycol diethyl ether, tetrahydrofuran, tetrahydropyran and 1,4-dioxane.

Examples of the esters derived from water-soluble alcohols above include methyl formate, ethyl formate, butyl formate, methyl acetate, ethyl acetate, butyl acetate, methyl propionate, ethyl propionate, butyl propionate and γ-butyrolactone.

5.3.4) Average Particle Size of Encapsulated Metal Nano-Ink

The average particle size of the encapsulated metal nano-ink 115a is described below with reference to FIGS. 1C and 1D.

The width of the conductive interconnects 114 of the electric connection member 100 is assigned with L1, the height of the conductive interconnects 114 with H1, the depth of the recesses 113 of the electric connection member 100 with H2, the thickness of layers formed of the encapsulated metal nano-ink 115a (hereinafter called "encapsulated metal nano-ink layer") with H3, the arithmetic mean roughness of electric connection surfaces of the electrodes 214 of the electronic component 200 when the surfaces have irregularities with Ra, and the average particle size of capsules of the encapsulated metal nano-ink 115a with φ.

When L1 is less than 10 μm, it is difficult to finely manufacture electrode interconnects, and therefore L1 is preferably in a range from 10 μm to 300 μm.

The height difference between the upper surface of each conductive interconnect 114 and a surface of the insulating adhesive layer 112, i.e., H2−H1, is preferably not less than H3. With H2−H1 being not greater than H3, when a mounted component is pressed and capsules are broken, an encapsulated object is to be scattered, and a partitioning effect by the recesses 113 of the electric connection member 100 is reduced.

Ra is preferably not more than 0.74×H3. With Ra being more than 0.74×H3, even when a mounted component is pressed and the conductive thin films 116 are formed on the conductive interconnects 114, it is still insufficient to embed the electric connection surfaces with the height difference, resulting in unstable electric characteristics.

Preferably, φ is not less than 1 μm. With φ being less than 1 μm, a pressing force is to be dispersed, which may make it difficult to sufficiently break capsules. Preferably, φ is not greater than ½ of L1. With φ being greater than ½ of L1, the number of capsules disposed on each conductive interconnect 114 is to be one, which makes capsules difficult to conform to the irregularities at the electric connection surfaces of the electrodes 214. The conformability to the irregularities at the electric connection surfaces of the electrodes 214 improves with increasing number of capsules disposed on each conductive interconnect 114, and therefore φ is preferably not greater than ⅓ of L1, more preferably not greater than ¼ of L1, and still more preferably not greater than ⅕ of L1. Thus, φ is preferably greater than 1 μm and not greater than ½ of L1, more preferably greater than 1 μm and not greater than ⅓ of L1, still more preferably greater than 1 μm and not greater than ¼ of L1, and even more preferably greater than 1 μm and not greater than ⅕ of L1.

EXAMPLE

The characteristic features of the present invention are more specifically described below by way of examples.

However, the present invention should not be construed as being limited to the examples.

<Production of Encapsulated Metal Nano-Ink>

A metal nano-ink (hereinafter sometimes called "room temperature sintering ink") was prepared by the method described in Example 1 of JP 2012-162767 A.

Sodium alginate (1.0 g) was weighed and dissolved in Milli-Q water, and the whole mixture was diluted to 100 mL, thereby preparing a 1.0% (w/v) aqueous sodium alginate solution.

To a 20% (w/v) aqueous calcium chloride solution, 1.0% (w/v) aqueous sodium alginate solution and a room temperature sintering ink were added dropwise from separate injector-type devices. By placing tip portions of the two injector-type devices close to each other and adjusting the dropping rates of the two solutions, the room temperature sintering ink enclosed by the aqueous sodium alginate solution was added dropwise to the aqueous calcium chloride solution, and the aqueous sodium alginate solution immediately gelated to encapsulate the room temperature sintering ink (see FIG. 4B).

After 30 minutes, an encapsulated metal nano-ink having the room temperature sintering ink encapsulated by capsules formed of calcium alginate was taken out from the aqueous calcium chloride solution and dried by air at room temperature for 24 hours, thereby producing an encapsulated metal nano-ink. The encapsulated metal nano-ink had an average particle size of 3 μm.

What is claimed is:

1. An electric connection member comprising a substrate, an insulating adhesive layer provided on the substrate, and a conductive interconnect,
   wherein the electric connection member is provided with
      a recess that opens at a side of the insulating adhesive layer, the conductive interconnect is disposed in the recess,
a metal nano-ink is disposed on the conductive interconnect, and
all of the metal nano-ink is contained inside the recess, and
wherein the metal nano-ink is an encapsulated metal nano-ink that has a plurality of metal nanoparticles covered by a protective agent in a capsule and that forms a conductive thin film upon breaking of the capsule by means of external stimulus.

2. The electric connection member according to claim 1, wherein the conductive thin film is formed by breaking the capsule and performing heat treatment at a temperature of less than 200° C.

3. The electric connection member according to claim 2, wherein the protective agent is an amphiphilic molecule, the plurality of metal nanoparticles are dispersed in a hydrophobic organic solvent, and the capsule is composed of a hydrophilic compound derivative.

4. The electric connection member according to claim 2, wherein the substrate is a flexible substrate.

5. A mounting structure of an electronic component assembly in which an electronic component having an electrode is mounted on the electric connection member according to claim 2,
wherein the conductive interconnect and the electrode are joined to each other by sintering the metal nano-ink in the recess of the insulating adhesive layer, and a surface of the insulating adhesive layer adheres to a surface of the electronic component.

6. An intermediate member used for producing the electric connection member according to claim 2, the intermediate member comprising a substrate, an insulating adhesive layer provided on the substrate, and a conductive interconnect,
wherein the intermediate member is provided with a recess that opens at a side of the insulating adhesive layer, and
the conductive interconnect is disposed in the recess.

7. The electric connection member according to claim 1, wherein the protective agent is an amphiphilic molecule, the plurality of metal nanoparticles are dispersed in a hydrophobic organic solvent, and the capsule is composed of a hydrophilic compound derivative.

8. The electric connection member according to claim 7, wherein the hydrophobic organic solvent has an n-octanol/water partition coefficient of not less than 2.

9. The electric connection member according to claim 7, wherein the hydrophilic compound derivative has a contact angle of not more than 90° with respect to water.

10. The electric connection member according to claim 7, wherein the amphiphilic molecule has a hydrophile-lipophile balance value of 0 to 13.

11. The electric connection member according to claim 7, wherein the substrate is a flexible substrate.

12. A mounting structure of an electronic component assembly in which an electronic component having an electrode is mounted on the electric connection member according to claim 7,
wherein the conductive interconnect and the electrode are joined to each other by sintering the metal nano-ink in the recess of the insulating adhesive layer, and a surface of the insulating adhesive layer adheres to a surface of the electronic component.

13. An intermediate member used for producing the electric connection member according to claim 7, the intermediate member comprising a substrate, an insulating adhesive layer provided on the substrate, and a conductive interconnect,
wherein the intermediate member is provided with a recess that opens at a side of the insulating adhesive layer, and
the conductive interconnect is disposed in the recess.

14. The electric connection member according to claim 2, wherein the substrate is a flexible substrate.

15. A mounting structure of an electronic component assembly in which an electronic component having an electrode is mounted on the electric connection member according to claim 1,
wherein the conductive interconnect and the electrode are joined to each other by sintering the metal nano-ink in the recess of the insulating adhesive layer, and a surface of the insulating adhesive layer adheres to a surface of the electronic component.

16. An intermediate member used for producing the electric connection member according to claim 1, the intermediate member comprising a substrate, an insulating adhesive layer provided on the substrate, and a conductive interconnect,
wherein the intermediate member is provided with a recess that opens at a side of the insulating adhesive layer, and
the conductive interconnect is disposed in the recess.

* * * * *

UNITED STATES PATENT AND TRADEMARK OFFICE
CERTIFICATE OF CORRECTION

PATENT NO. : 10,314,175 B2
APPLICATION NO. : 15/613752
DATED : June 4, 2019
INVENTOR(S) : Junya Sato It is certified that error appears in the above-identified patent and that said Letters Patent is hereby corrected as shown below:

In the Specification

Figure 6A:
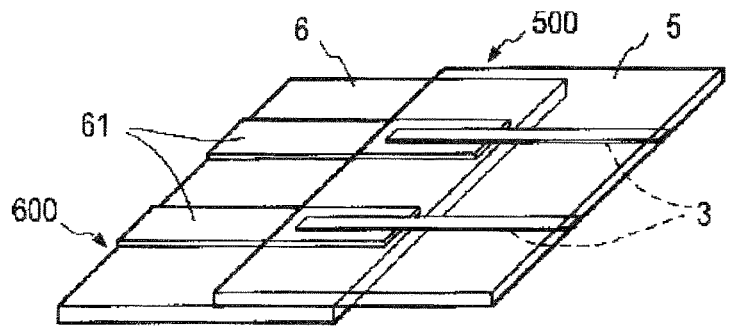
FIGS. 6A-6B are a view showing the electric connection member and the electrode substrate shown in FIGS. 1(a) and 1(b) of JP 2003-045517 A.
Figure 6B:
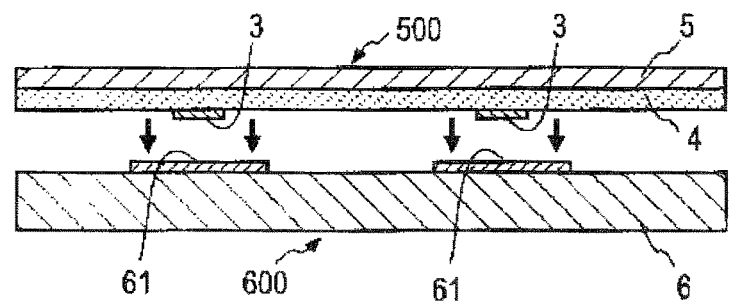

Column 1, Line 42, change "below with reference to, among attached drawings, FIG. 6" to --below with reference to, among attached drawings, FIGS. 6A-6B,--

In the Claims

The claims should be changed to:

WHAT IS CLAIMED IS:
1. An electric connection member comprising a substrate, an insulating adhesive layer provided on the substrate, and a conductive interconnect,
    wherein the electric connection member is provided with a recess that opens at a side of the insulating adhesive layer,
    the conductive interconnect is disposed in the recess,
    a metal nano-ink is disposed on the conductive interconnect, and
    all of the metal nano-ink is contained inside the recess, and
    wherein the metal nano-ink is an encapsulated metal nano-ink that has a plurality of metal nanoparticles covered by a protective agent in a capsule and that forms a conductive thin film upon breaking of the capsule by means of external stimulus.

2. The electric connection member according to claim 1, wherein the conductive thin film is formed by breaking the capsule and performing heat treatment at a temperature of less than 200° C.

3. The electric connection member according to claim 1, wherein the protective agent is an amphiphilic molecule, the plurality of metal nanoparticles are dispersed in a hydrophobic organic solvent, and the capsule is composed of a hydrophilic compound derivative.

4. The electric connection member according to claim 2, wherein the protective agent is an amphiphilic molecule, the plurality of metal nanoparticles are dispersed in a hydrophobic organic Signed and Sealed this
Seventeenth Day of December, 2019

Andrei Iancu
*Director of the United States Patent and Trademark Office* solvent, and the capsule is composed of a hydrophilic compound derivative.

5. The electric connection member according to claim 3, wherein the hydrophobic organic solvent has an n-octanol/water partition coefficient of not less than 2.

6. The electric connection member according to claim 3, wherein the hydrophilic compound derivative has a contact angle of not more than 90° with respect to water.

7. The electric connection member according to claim 3, wherein the amphiphilic molecule has a hydrophile-lipophile balance value of 0 to 13.

8. The electric connection member according to claim 1, wherein the substrate is a flexible substrate.

9. The electric connection member according to claim 2, wherein the substrate is a flexible substrate.

10. The electric connection member according to claim 3, wherein the substrate is a flexible substrate.

11. A mounting structure of an electronic component assembly in which an electronic component having an electrode is mounted on the electric connection member according to claim 1,
wherein the conductive interconnect and the electrode are joined to each other by sintering the metal nano-ink in the recess of the insulating adhesive layer, and a surface of the insulating adhesive layer adheres to a surface of the electronic component.

12. A mounting structure of an electronic component assembly in which an electronic component having an electrode is mounted on the electric connection member according to claim 2,
wherein the conductive interconnect and the electrode are joined to each other by sintering the metal nano-ink in the recess of the insulating adhesive layer, and a surface of the insulating adhesive layer adheres to a surface of the electronic component.

13. A mounting structure of an electronic component assembly in which an electronic component having an electrode is mounted on the electric connection member according to claim 3,
    wherein the conductive interconnect and the electrode are joined to each other by sintering the metal nano-ink in the recess of the insulating adhesive layer, and a surface of the insulating adhesive layer adheres to a surface of the electronic component.

14. An intermediate member used for producing the electric connection member according to claim 1, the intermediate member comprising a substrate, an insulating adhesive layer provided on the substrate, and a conductive interconnect,
    wherein the intermediate member is provided with a recess that opens at a side of the insulating adhesive layer, and
    the conductive interconnect is disposed in the recess.

15. An intermediate member used for producing the electric connection member according to claim 2, the intermediate member comprising a substrate, an insulating adhesive layer provided on the substrate, and a conductive interconnect,
    wherein the intermediate member is provided with a recess that opens at a side of the insulating adhesive layer, and
: the conductive interconnect is disposed in the recess.

16. An intermediate member used for producing the electric connection member according to claim 3, the intermediate member comprising a substrate, an insulating adhesive layer provided on the substrate, and a conductive interconnect,
: wherein the intermediate member is provided with a recess that opens at a side of the insulating adhesive layer, and
: the conductive interconnect is disposed in the recess.